(12) United States Patent
Chu

(10) Patent No.: US 8,860,488 B2
(45) Date of Patent: Oct. 14, 2014

(54) APPARATUSES AND METHOD FOR SHIFTING A VOLTAGE LEVEL

(71) Applicant: Micron Technology, Inc., Boise, ID (US)

(72) Inventor: Daniel Chu, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/787,475

(22) Filed: Mar. 6, 2013

(65) Prior Publication Data

US 2014/0253209 A1    Sep. 11, 2014

(51) Int. Cl.
*H03L 5/00* (2006.01)
*H03K 19/003* (2006.01)

(52) U.S. Cl.
CPC .............. *H03K 19/003* (2013.01); *H03L 5/00* (2013.01)
USPC ............................ 327/333; 326/62; 326/81

(58) Field of Classification Search
USPC ................. 326/62–63, 80–81; 327/306, 333
See application file for complete search history.

(56) References Cited

U.S. PATENT DOCUMENTS

| | | | | |
|---|---|---|---|---|
| 5,888,033 A | * | 3/1999 | Zagar et al. | 408/14 |
| 5,999,033 A | * | 12/1999 | Keeth et al. | 327/333 |
| 6,239,624 B1 | * | 5/2001 | Yang et al. | 327/55 |
| 7,176,741 B2 | * | 2/2007 | Ishikawa et al. | 327/333 |
| 8,115,514 B2 | * | 2/2012 | Deng | 326/68 |
| 8,461,899 B2 | * | 6/2013 | Rana | 327/333 |

* cited by examiner

*Primary Examiner* — Dinh Le
(74) *Attorney, Agent, or Firm* — Dorsey & Whitney LLP (57) ABSTRACT

Apparatuses and methods, such as those for shifting a voltage level are disclosed. An example apparatus includes a level shifter configured to provide output signals based on a logical value of an input signal, where the level shifter is precharged to a precharge voltage prior to providing the output signals. An example method includes precharging an output node of a level shifter to a precharge voltage responsive to a precharge signal via a precharge circuit. A transition of the input signal from a first logical value to a second logical value is received at the level shifter and an output signal is provided at the output node based on the second logical value of the input signal.

23 Claims, 6 Drawing Sheets

APPARATUSES AND METHOD FOR SHIFTING A VOLTAGE LEVEL

TECHNICAL FIELD

Embodiments of the disclosure relate generally to electronic memories, and more particularly, in one or more of the illustrated embodiments, to voltage level shifters.

BACKGROUND OF THE DISCLOSURE

Advances in technology have resulted in high density memory architectures. The desire for increased density is somewhat restricted by physical characteristics of smaller circuit devices being incapable of performing a desired function. For example, level shifters are often employed to shift the voltage of an input signal to a different voltage, for example, from a first voltage for the input signal to a higher voltage for the output signal or from a second voltage for the input signal to a lower voltage for the output signal. In operation, when a logical value of an input signal transitions, a level shifter must be capable of altering the voltage held at an output node from one logical value to another by overriding the node voltage. The node voltage may, in some cases, be greater than a voltage driving override circuits employed to override the node voltage. Thus, in conventional level shifters the override circuits may require greater drive strength than hold circuits employed to hold the node voltage. Therefore, the override and hold circuits may be limited to having a size relationship for proper operation, that is, in order for the override devices to be able to overpower the hold devices. Due to constraints on the size relationship between the hold devices and the override devices, an ability to reduce a surface area of the level shifter may be limited. Thus, a solution is desired to decrease surface area of the level shifter.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
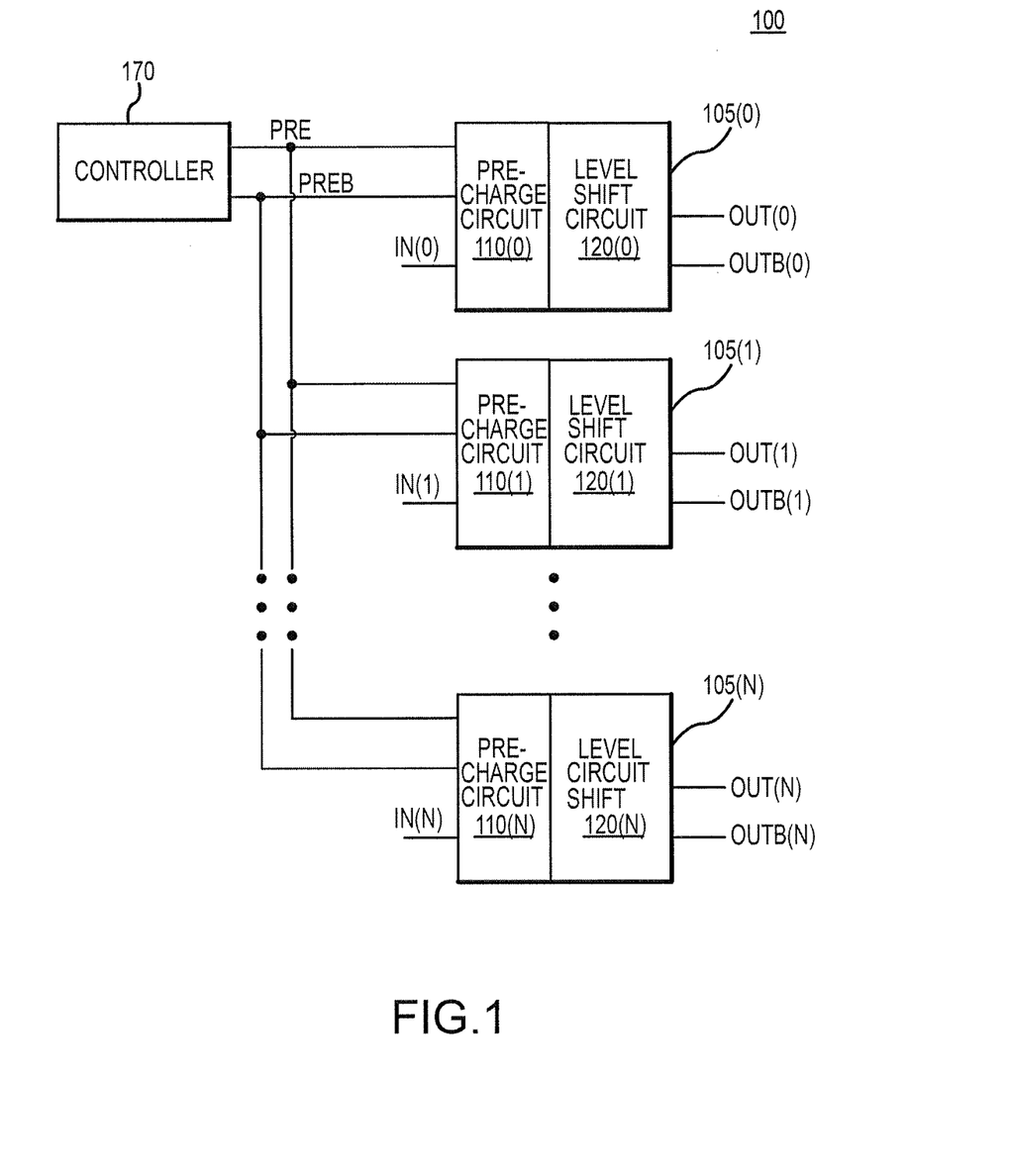
FIG. 1 is a block diagram of an exemplary apparatus including level shifters according to an embodiment of the present disclosure.

FIG. 1 is a block diagram of an exemplary apparatus including level shifters according to an embodiment of the disclosure. As used herein, examples of apparatuses may include an integrated circuit, a memory device, a memory system, an electronic device or system, a smart phone, a tablet, a computer, a server, etc. The apparatus 100 may include a controller 170 configured to provide precharge signals PRE and PREB to level shifters 105(0-N) to precharge level shift circuits 120(0-N) via precharge circuits 110(0-N). After precharging, OUT(0-N) and OUTB(0-N) signals based on a respective input signal IN(0-N) may be provided. The level shifters 105(0-N) may have reduced surface area as compared with conventional level shifters as previously described.

As explained above, the controller 170 may provide the PRE and PREB signals to each of the level shifters 105(0-N). In some embodiments, a magnitude of the PRE signal having a high logical value may be greater than a magnitude of the PREB signal having a high logical value. For example, a magnitude of the PRE signal having a high logical value may be equal to 1 volt and a magnitude of the PRE signal having a high logical value may be greater than 5 volts. In other embodiments, the voltage magnitudes of the high logical values of the PRE and PREB signals may be equal.

Each of the level shifters 105(0-N) may include a respective precharge circuit 110(0-N) and a respective level shift circuit 120(0-N). Each of the precharge circuits 110(0-N) may be configured to receive the PRE signal, the PREB signal, and the respective IN(0-N) signal. Each of the level shift circuits 120(0-N) may be coupled to the respective precharge circuit 110(0-N) and may be configured to provide the respective OUT(0-N) signal and the respective OUTB(0-N) signal at an output. The OUTB(0-N) signal may be a logical complement of the OUT(0-N) signal. In some embodiments, the logical value of the respective OUT(0-N) signal may be equal to a logical value of the respective IN(0-N) signal. In some embodiments, a voltage magnitude of the respective IN(0-N) signal having a high logical value may be less than a voltage magnitude of the associated OUT(0-N) signal having a high logical value.

In operation, each of the level shifters 105(0-N) may be configured to provide the respective OUT(0-N) and OUTB(0-N) signals having logical values based on logical value of the associated IN(0-N) signal. The precharge circuits 110(0-N) of a respective level shifters 105(0-N) may be configured to precharge the level shift circuits 120(0-N) to a precharge voltage to facilitate provision of the OUT(0-N) and OUTB(0-N) signals by the respective level shift circuits 120(0-N). For example, the controller 170 may be configured to provide the PRE signal having a first logical value and the PREB signal having a second logical value to each of the precharge circuits 110(0-N). Each of the precharge circuits 110(0-N) may be configured to precharge the respective level shift circuit 120(0-N) to the precharge voltage responsive to the PRE signal having the first logical value and the PREB signal having the second logical value.

After the level shift circuits 120(0-N) are precharged to the precharged voltage, a logical value of one or more of the IN(0-N) signals may transition to an opposite logical value (e.g., from a first logical value to a second logical value or from a second logical value to a first logical value). The controller 170 may be configured to transition the PRE signal to a second logical value and the PREB to a first logical value. Responsive to transition of the PRE and PREB signals, each of the respective level shift circuits 120(0-N) may be configured to provide one of the respective OUT(0-N) signal or the respective OUTB(0-N) signal having a first logical value and the other having the second logical value. The one of the respective OUT(0-N) signal or the respective OUTB(0-N) signal having a first logical value and the other having the second logical value may be based on a logical value of the associated IN(0-N) signal. For example, if the IN(0-N) signal provided to a level shifter 105(0-N) has a first logical value, the respective level shift circuit 120 may be configured to provide the respective OUT signal having the first logical value and the respective OUTB signal having the second logical value. Further, if the associated IN(0-N) signal provided to the level shifter 105(0-N) has a second logical value, the respective level shift circuit 120 may be configured to provide the OUT signal having the second logical value and the OUTB signal having the first logical value.

In some embodiments, the first logical value of the IN(0-N) signals may be VDD voltages and the second logical value of the IN(0-N) signals may be a reference voltage (e.g., ground). In some embodiments, the first logical value of the OUT(0-N) and OUTB(0-N) signals may be greater than the VDD voltage, for example, a pumped positive voltage VPP greater than VDD, and the second logical values may be the reference voltages. In other embodiments, the first logical value of the OUT(0-N) and OUTB(0-N) signals may be VDD voltages and the second logical values may be less than a reference voltage such as ground, for example, the second logical values may be more negative, for example, a pumped negative voltage VNN less than ground.

It will be appreciated that, while the apparatus 100 depicts three of the level shifters 105(0-N), the apparatus 100 may be modified to include more or less than three of the level shifters 105(0-N). Designing one or more of the level shifters 105(0-N) to include the respective precharge circuits 110(0-N) to precharge the level shift circuits 120(0-N) may reduce a need for a portion of the level shift circuits 120(0-N) to overpower another portion of the level shift circuits 120(0-N), which may reduce an area of the level shifters 105(0-N) as compared with conventional level shifters.

Figure 2:
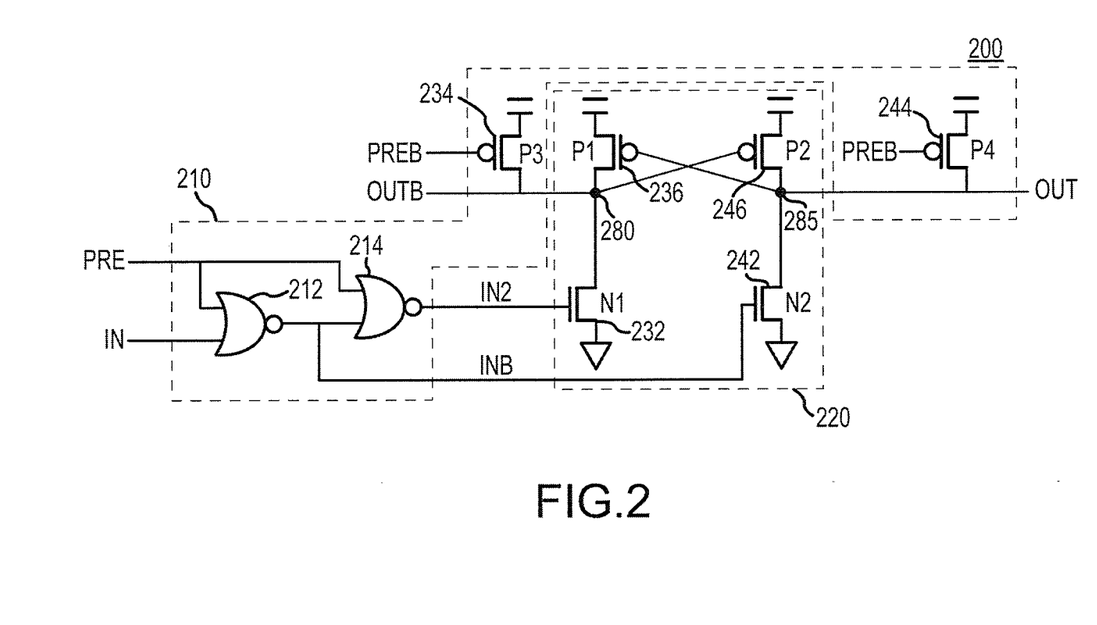
FIG. 2 is a schematic diagram of a level shifter according to an embodiment of the present disclosure.

FIG. 2 is a block diagram of an exemplary apparatus including a level shifter according to an embodiment of the disclosure. The level shifter 200 may include a precharge circuit 210 configured to precharge a level shift circuit 220 in providing an output signal OUT at a first (OUT) node 285 and an output bar signal OUTB signal at a second (OUTB) node 280. The level shift circuit 220 may be configured to provide the OUT signal and the OUTB signal based on a logical value of an input signal IN. After precharging, based on a logical value of the IN signal, the level shifter 200 may be configured provide one of the OUT signal and the OUTB signal at a reference voltage and the other at a VPP voltage. The precharge circuit 210 may correspond to precharge circuits 110 (0-N) of FIG. 1, and the level shift circuit 220 may correspond to level shift circuits 120(0-N) of FIG. 1. Including the precharge circuit 210 to precharge the level shift circuit 220 prior to providing the OUT signal and the OUTB signal may result in an overall smaller area for the level shifter 200 as compared with conventional level shifters.

The precharge circuit 210 may include a first NOR gate 212 and a second NOR gate 214. The first NOR gate 212 may be configured to receive the IN signal and a precharge signal PRE, and to provide an input bar signal INB at an output based on logical values of the IN and PRE signals. The second NOR gate 214 may be configured to receive the INB signal and the PRE signal and to provide a second input signal IN2 at an output based on logical values of the INB and PRE signals. Responsive to the PRE signal having a low logical value, the first NOR gate 212 and the second NOR gate 214 may be configured to provide the IN2 signal having a logical value equal to the IN signal, and provide the INB signal having a logical value equal to a complement of the IN signal. While the PRE signal has a high logical value, the first NOR gate 212 and the second NOR gate 214 may be configured to provide the INB signal and the IN2 signal, respectively, having low logical values, effectively ignoring the IN signal.

The precharge circuit 210 may further include a first precharge transistor P3 234 and a second precharge transistor P4 244. The P3 transistor 234 may be coupled between the first node 280 and the VPP voltage source (e.g., a drain of the P3 transistor 234 is coupled to the first node 280 and a source of the P3 transistor 234 is coupled to the VPP source), with a gate configured to receive the PREB signal. The P4 transistor 244 may be coupled between the second node 285 and the VPP voltage source (e.g., a drain of the P4 transistor 244 is coupled to the second node 285 and a source of the P4 transistor 244 is coupled to the VPP source), with a gate configured to receive the PREB signal. The P3 transistor 234 and P4 transistor 244 may be p-type field-effect transistors (PFET) (e.g., the source and the drain are doped with a p-type dopant). Responsive to the PREB signal having the low logical value (e.g., the reference voltage), the P3 transistor 234 and the P4 transistor 244 may be configured to couple the VPP voltage to the first node 280 and the second node 285, respectively. Further, responsive to the PREB signal having the high logical value (e.g., the VPP voltage), the P3 transistor 234 and the P4 transistor 244 may be configured to decouple the VPP voltage from the first node 280 and the second node 285, respectively.

The level shift circuit 220 may include a first hold transistor P1 236, a second hold transistor P2 246, a first transistor N1 232, and a second transistor N2 242. The P1 transistor 236 may be coupled between the first node 280 and the VPP voltage source (e.g., a drain of the P1 transistor 236 is coupled to the first node 280 and a source of the P1 transistor 236 is coupled to the VPP voltage source), with a gate coupled to the second node 285. The P2 transistor 246 may be coupled between the second node 285 and the VPP voltage source (e.g., a drain of the P2 transistor 246 is coupled to the second node 285 and a source of the P2 transistor 246 is coupled to the VPP voltage source), with a gate coupled to the first node 280. The N1 transistor 232 may be coupled between the first node 280 and the reference voltage source (e.g., a drain of the N1 transistor 232 is coupled to the first node 280 and a source of the N1 transistor 232 is coupled to the reference voltage source), with a gate configured to receive the IN2 signal. The N2 transistor 242 may be coupled between the second node 285 and the reference voltage source (e.g., a drain of the N2 transistor 242 is coupled to the second node 285 and a source of the N2 transistor 242 is coupled to the reference voltage source), with a gate configured to receive the INB signal. In an embodiment, the P1 transistor 236 and the P2 transistor 246 are PFET transistors and the N1 transistor 232 and N2 transistor 242 are n-type field-effect transistors (NFET) (e.g., having the source and the drain are doped with an n-type dopant).

In operation, the level shifter 200 may be configured to provide the OUT and OUTB signals based a logical value of the IN signal. During operation, the precharge circuit 210 may be configured to precharge the first node 280 and the second node 285 to the VPP voltage (e.g., the precharge voltage). During the precharge process, the precharge circuit 210 may be configured to receive the PRE signal having the high logical value (e.g., a VDD voltage). Responsive to the PRE signal having the high logical value, the first NOR gate 212 may be configured to provide the INB signal to the gate of the N2 transistor 242 having a low logical value and the second NOR gate 214 may be configured to provide the IN2 signal to the gate of the N1 transistor 232 having the low logical value. Responsive to the gates of the N1 transistor 232 and the N2 transistor 242 receiving the IN2 signal and the NB signal, respectively, having the low logical values, the N1 transistor 232 and the N2 transistor 242 may be configured to decouple the first node 280 and the second node 285, respectively, from the reference voltage.

After decoupling the reference voltage from the first node 280 and the second node 285 via the N1 transistor 232 and N2 transistor 242, respectively, the PREB signal received at the gates of the P3 transistor 234 and P4 transistor 244 may transition to the low logical value. Responsive to receiving the PREB signal having the low logical value, the P3 transistor 234 and P4 transistor 244 may be configured to precharge the first node 280 and the second node 285, respectively, to the VPP voltage by coupling the VPP voltage source to the first node 280 and the second node 285. Due to the N1 transistor 232 and the N2 transistor 242 decoupling the reference voltage from the first node 280 and the second node 285, respectively, the first node 280 and the second node 285 maybe precharged to the VPP voltage.

After the first and second nodes 280 and 285 are precharged to the VPP voltage, the PREB signal may transition to the high logical value and the PRE signal may transition to the low logical value. Responsive to the PREB signal transitioning to the high logical value, the P3 transistor 234 and the P4 transistor 244 decouple the first node 280 and the second node 285, respectively, from the VPP voltage source. Responsive to the PRE signal transitioning to the low logical value, the first NOR gate 212 and the second NOR gate 214 may be configured to provide the INB signal and the IN2 signal, respectively, having a logical value based on the IN signal. Thus, the IN2 signal may be equal to the logical value of the IN signal, and the INB signal may be equal to a logical value complementary to the IN signal. Responsive to logical values of the IN2 and INB signals, one of the N1 transistor 232 or the N2 transistor 242 may couple the first node 280 or the second node 285, respectively, to the reference voltage.

For example, responsive to the IN signal having the high logical value, the IN2 signal has the high logical value and the INB signal has the low logical value. Based on the IN2 signal having the high logical value, the N1 transistor 232 couples the first node 280 to the reference voltage (e.g., a low logical value), and based on the INB signal having the low logical value, the N2 transistor 242 allows the second node 285 to remain at the precharge voltage (e.g., the high logical value). As explained above, the gate of the P2 transistor 246 is coupled to the first node 280. Thus, responsive to the first node 280 being coupled to the reference voltage, the gate of the P2 transistor 246 may be coupled to the reference voltage. The reference voltage at the gate of the P2 transistor 246 may cause the P2 transistor 246 to couple the second node 285 to the VPP voltage (e.g., the high logical value). Thus, while the IN signal has the high logical value, the level shifter 200 provides the OUT signal at the second node 285 having the high logical value (e.g., the VPP voltage) and the OUTB signal at the first node 280 having the low logical value (e.g., the reference voltage).

The level shifter 200 operates similarly responsive to the IN signal having the low logical value. For example, responsive to the IN signal having the low logical value, the IN2 signal has the low logical value and the INB signal has the high logical value. Based on the IN2 signal having the low logical value, the N1 transistor 232 allows the first node 280 to remain at the precharge voltage (e.g., the high logical value), and based on the INB signal having the high logical value, the N2 transistor 242 couples the second node 285 to the reference voltage. As explained above, the gate of the P1 transistor 236 is coupled to the second node 285. Thus, responsive to the second node 285 being coupled to the reference voltage, the gate of the P1 transistor 236 may be coupled to the reference voltage. The reference voltage at the gate of the P1 transistor 236 may cause the P1 transistor 236 to provide the VPP voltage (e.g., the high logical value) to the first node 280. Thus, while the IN signal has the low logical value, the level shifter 200 provides the OUT signal at the first node 280 having the low logical value and the OUTB signal at the second node 285 having the high logical value.

In some embodiments, the high logical values of the IN signal, the IN2, and the INB signals may be equal to VDD voltage. The VDD voltage may be less than the VPP voltage. For example, the VDD voltage may be approximately one volt and the VPP voltage may be equal to or greater than five volts. A size (e.g., length and width) of the P3 transistor 234 may be equal to a size of the P4 transistor 244, and a size of the P1 transistor 236 may be equal to a size of the P2 transistor 246. In some embodiments, the P3 transistor 234, the P1 transistor 236, the P4 transistor 244, and the P2 transistor 246 may all have equal sizes (e.g., lengths and widths). A size of the N1 transistor 232 may be equal to a size of the N2 transistor 242. It will be appreciated that, while the level shifter 200 includes PFETs and NFETs, other circuit designs may be used to implement the level shifter 200.

Figure 3:
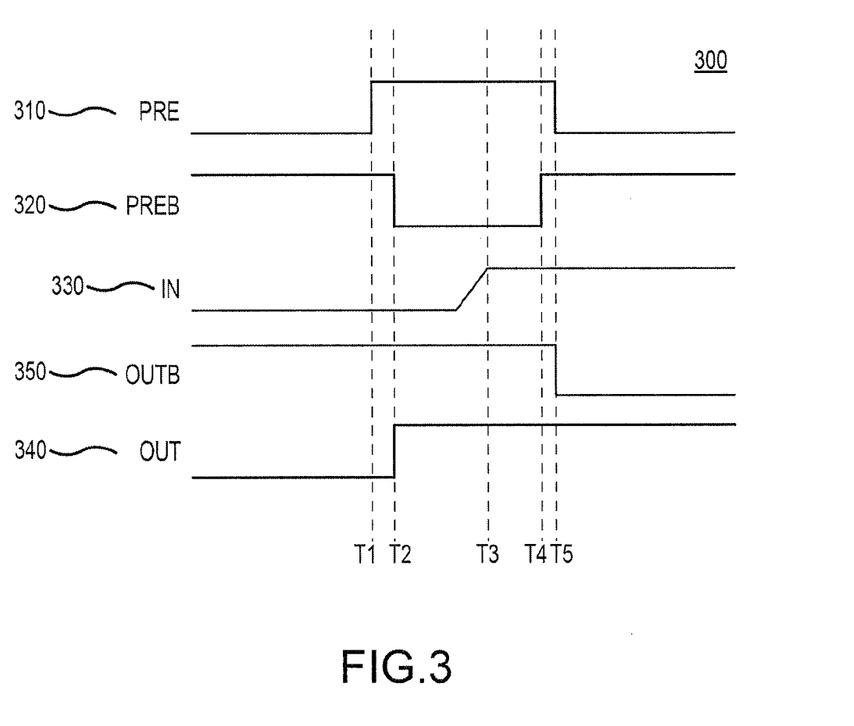
FIG. 3 is an exemplary timing diagram of various signals during operation of a level shifter according to an embodiment of the disclosure.

Referring to FIG. 3, an exemplary timing diagram of various signals during operation of a particular illustrative embodiment of a level shifter is disclosed and generally designated 300. For example, the exemplary timing diagram 300 may illustrate timing characteristics of a level shifter 105(0-N) of FIG. 1 and/or the level shifter 200 of FIG. 2. A precharge signal PRE 310 and a precharge bar signal PREB 320 may correspond to the PRE and PREB signals, respectively, of FIGS. 1 and 2. An input signal IN 330 may correspond to an IN(0-N) signal of FIG. 1 and/or the IN signal of FIG. 2. An output signal OUT 340 and an output bar signal OUTB 350 may correspond to an OUT(0-N) signal and an OUTB(0-N) signal, respectively, of FIG. 1, and/or the OUT signal and OUTB signal, respectively, of FIG. 2.

In the exemplary timing diagram 300, prior to time T1, the IN signal 330 has a low logical value. Based on the IN signal 330 having the low logical value, the OUT signal 340 is provided at a low logical value and the OUTB signal 350 is provided at a high logical value. At time T1, precharge of a level shift circuit is initiated by the PRE signal 310 transitioning to a high logical value. The PRE signal 310 having the high logical value may configure a portion of the level shift circuit, such as the N1 transistor 232 and the N2 transistor 242 of FIG. 2, to prevent the OUT signal 340 and the OUTB signal 350 from transitioning to the low logical value.

At time T2, the PREB signal is set to a low logical value. Responsive to the PREB signal 320 having the low logical value, OUT and OUTB nodes (e.g., the first node 280 and the second node 285) are precharged to a precharge voltage (e.g., the OUT signal 340 transitions to a precharge voltage and the OUTB signal 350 remains at the precharge voltage) via precharge transistors, such the P3 transistor 234 and/or the P4 transistor 244 of FIG. 2.

At time T3, the IN signal 330 transitions to a high logical value. At time T4, the PREB signal 320 transitions to the high logical value (e.g., a VPP voltage), and at time T5, the PRE signal 310 transitions back to the low logical value. Responsive to the PRE signal 310 having the low logical value, the level shift circuit may be configured to provide the OUT signal 340 and the OUTB signal 350 based on a logical value of the IN signal 330. Thus, as shown, after time T5, based on the IN signal 330 having the high logical value, the OUTB signal 350 may have the low logical value (e.g., a reference voltage), while the OUT signal 340 may have the high logical value (e.g., a VPP voltage).

As explained above, a voltage magnitude of the high logical values of the IN signal 330 may be less than a voltage magnitude of the high logical value of OUT 340 and OUTB signals 350. For example, the high logical value of the IN signal 330 may be a VDD voltage and the high logical value of the OUT 340 and OUTB signals 350 may be a VPP voltage. In some embodiments, a high logical value of the PREB signal 320 may be a VPP voltage and a low logical value may be a reference voltages.

The exemplary timing diagram 300 is a non-limiting illustration to provide a sufficient understanding of embodiments of the disclosure. Those of ordinary skill in the art will appreciate that the relative timing of the signals of the exemplary timing diagram 300 may vary from system to system. For example, a time to precharge the OUT 340 and OUTB signals 350 may take shorter or longer than indicated, and transitioning of the OUTB signal 350 may occur more slowly or quickly than indicated.

Figure 4:
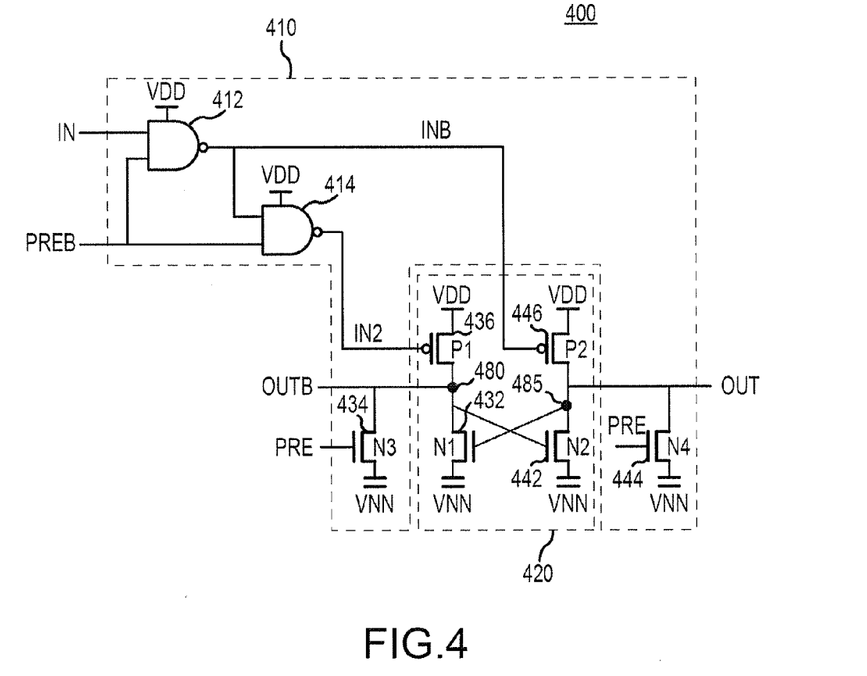
FIG. 4 is a schematic diagram of a level shifter according to an embodiment of the present disclosure.

FIG. 4 is a block diagram of an exemplary apparatus including a level shifter according to an embodiment of the disclosure. The level shifter 400 may include a precharge circuit 410 configured to precharge a level shift circuit 420 prior to providing an output signal OUT at a second (OUT) node 485 and an output bar signal OUTB signal at a first (OUTB) node 480. The level shift circuit 420 is configured to provide the OUT signal and the OUTB signal based on a logical value of an input signal IN. After precharging, based on a logical value of the IN signal, the level shifter 400 may be configured provide one of the OUT signal and the OUTB signal at a pumped negative voltage VNN and the other at a VDD voltage. The precharge circuit 410 may correspond to a precharge circuit 110 of FIG. 1, and the level shift circuit 420 may correspond to a level shift circuit 120 of FIG. 1. The level shifter 400 may have the precharge circuit 410 that covers an overall smaller area as compared with conventional level shifters.

The precharge circuit 410 may include a first NAND gate 412 and a second NAND gate 414. The first NAND gate 412 may be configured to receive the IN signal and a precharge bar signal PREB, and to provide an INB signal at an output based on logical values of the IN and PREB signals. The second NAND gate 414 may be configured to receive the INB signal and the PREB signal and to provide a second input signal IN2 at an output based on logical values of the INB and PREB signals. Responsive to the PREB signal having a high logical value, the first NAND gate 412 and the second NAND gate 414 may be configured to provide the IN2 signal having a logical value equal to the IN signal, and provide the INB signal having a logical value equal to a complement of the IN signal. While the PREB signal has a low logical value, the first NAND gate 412 and the second NAND gate 414 may be configured to provide the IN2 signal and the INB signal, respectively, having high logical values, effectively ignoring the IN signal.

The precharge circuit 410 may further include an N3 transistor 434 and an N4 transistor 444. The N3 transistor 434 may be coupled between the first node 480 and the VNN voltage source (e.g., a drain of the N3 transistor 434 is coupled to the first node 480 and a source of the N3 transistor 434 is coupled to the VNN source), with a gate configured to receive the PRE signal. The N4 transistor 444 may be coupled between the second node 485 and the VNN voltage source (e.g., a drain of the N4 transistor 444 is coupled to the second node 485 and a source of the N4 transistor 444 is coupled to the VNN source), with a gate configured to receive the PRE signal. The N3 transistor 434 and N4 transistor 444 may be n-type FETs (NFET). Responsive to the PRE signal having the high logical value, the N3 transistor 434 and the N4 transistor 444 may be configured to couple the VNN voltage to the first node 480 and the second node 485, respectively. Further, responsive to the PRE signal having the low logical value, the N3 transistor 434 and the N4 transistor 444 may be configured to decouple the VNN voltage from the first node 480 and the second node 485, respectively.

The level shift circuit 420 may include a first transistor P1 436, a second transistor P2 446, a first hold transistor N1 432, and a second hold transistor N2 442. The P1 transistor 436 may be coupled between the first node 480 and the VDD voltage source (e.g., a drain of the P1 transistor 436 is coupled to the first node 480 and a source of the P1 transistor 436 is coupled to the VDD voltage source), with a gate configured to receive the IN2 signal. The P2 transistor 446 may be coupled between the second node 485 and the VDD source (e.g., a drain of the P2 transistor 446 is coupled to the second node 485 and a source of the P2 transistor 446 is coupled to the VDD voltage source), with a gate configured to receive the INB signal. The N1 transistor 432 may be coupled between the first node 480 and the VNN voltage source (e.g., a drain of the N1 transistor 432 is coupled to the first node 480 and a source of the N1 transistor 432 is coupled to the VNN voltage source), with a gate coupled to the second node 485. The N2 transistor 442 may be coupled between the second node 485 and the VNN voltage source (e.g., a drain of the N2 transistor 442 is coupled to the second node 485 and a source of the N2 transistor 442 is coupled to the VNN voltage source), with a gate coupled to the first node 280. In an embodiment, the P1 transistor 436 and the P2 transistor 446 are p-type FETs (PFET) and the N1 transistor 432 and N2 transistor 442 are NFETs.

In operation, the level shifter 400 may be configured to provide OUT and OUTB signals based a logical value of the IN signal. During operation, the precharge circuit 410 may be configured to precharge the first node 480 and second node 485. During the precharge process, the precharge circuit 410 may be configured to receive the PREB signal having the low logical value (e.g., a reference voltage). Responsive to the PREB signal having the low logical value, the first NAND gate 412 is configured to provide the INB signal to the gate of the P2 transistor 446 having the high logical value and the second NAND gate 414 is configured to provide the IN2 signal to the gate of the P1 transistor 436 having the high logical value. Responsive to the gates of the P1 transistor 436 and the P2 transistor 446 receiving the high logical values configures the P1 transistor 436 and the P2 transistor 446 to decouple the first node 480 and second node 485, respectively, from the VDD voltage source.

After decoupling the VDD voltage source from the first node 480 and the second node 485 via the P1 transistor 436 and P2 transistor 446, respectively, the PRE signal received at the gates of the N3 transistor 434 and N4 transistor 444 may transition to a high logical value. Responsive to the PRE signal having the high logical value, the N3 transistor 434 and N4 transistor 444 may be configured to precharge the first node 480 and second node 485, respectively, to the VNN voltage (e.g., the precharge voltage) by coupling the first node 480 and the second node 485 to the VNN voltage source. Due to the P1 transistor 432 and the N2 transistor 442 decoupling the VDD voltage from the first node 480 and the second node 485, respectively, the first node 480 and the second node 485 maybe be precharged to the VNN voltage.

After the first and second nodes 480 and 485 are precharged to the VNN voltage, the PRE signal may transition to the low logical value and the PREB signal may transition to the high logical value. Responsive to the PRE signal transitioning to the low logical value, the N3 transistor 434 and the N4 transistor 444 may be configured to decouple the first node 480 and the second node 485, respectively, from the VNN voltage source. Responsive to the PREB signal transitioning to the high logical value, the first NAND gate 412 and the second NAND gate 414 may be configured to provide the INB and the IN2 signals having logical values based on the IN signal. Thus, the IN2 signal may be equal to the logical value of the IN signal, and the INB signal may be equal to a logical value complementary to the IN signal. Responsive to logical values of the IN2 and NB signals, one of the P1 transistor 436 or the P2 transistor 446 may couple the first node 480 or the second node 485, respectively, to the VDD voltage.

For example, responsive to the IN signal having the high logical value, the IN2 signal has the high logical value and the INB signal has the low logical value. Based on the NB signal having the low logical value, the P2 transistor 446 may couple the second node 485 to the VDD voltage (e.g., charge the second node 485 to the VDD voltage), and based on the IN2 signal having the high logical value, the P1 transistor 436 may be configured to decouple the first node 480 from the VDD voltage. As explained above, the gate of the N1 transistor 432 is coupled to the second node 485. Thus, responsive to the second node 485 charging to the VDD, the gate of the N1 transistor 232 may be charged to the VDD voltage. The VDD voltage at the gate of the N1 transistor 432 may cause the N1 transistor 432 to couple the VNN voltage (e.g., a low logical value) to the first node 480. Thus, while the IN signal has the high logical value, the level shifter 400 provides the OUT signal having the high logical value (e.g., the VDD voltage) at the second node 485 and the OUTB signal having the low logical value (e.g., the VNN voltage) at the first node 480.

The level shifter 400 operates similarly responsive to the IN signal has the low logical value. For example, responsive to the IN signal having the low logical value, the IN2 signal has the low logical value and the NB signal has the high logical value. Based on the INB signal having the high logical value, the P2 transistor 446 may decouple the VDD voltage from the second node 485, and based on the IN2 signal having the low logical value, the P1 transistor 436 may be configured to couple the first node 480 to the VDD voltage source (e.g., couple the second node 485 to the VDD voltage). As explained above, the gate of the N2 transistor 444 is coupled to the first node 480. Thus, responsive to the first node 480 being coupled to the VDD voltage, the gate of the N2 transistor 444 is coupled to the VDD voltage. Responsive to VDD voltage at the gate of the N2 transistor 444, N2 transistor 444 may be configured to provide the VNN voltage (e.g., the low logical value) to the second node 485. Thus, while the IN signal has the low logical value, the level shifter 400 provides the OUT signal having the low logical value (e.g., the VNN voltage) at the second node 485 and the OUTB signal having the high logical value (e.g., the VDD voltage) at the first node 480.

In some embodiments, the high logical value of the IN signal, the IN2, and the INB signals may be equal to VDD. The VDD voltage may be greater than the VNN voltage. For example, the VDD voltage may be approximately one volt and the VNN voltage may be negative one volt. A size of the P1 transistor 436 may be equal to a size of the P2 transistor 446. A size of the N1 transistor 432 may be equal to a size of the N2 transistor 442, and a size of the N3 transistor 434 may be equal to a size of the N4 transistor 444. In some embodiments, the N1 transistor 432, the N3 transistor 434, the N2 transistor 442, and the P2 transistor 446 may all have equal sizes. It will be appreciated that, while the level shifter 400 includes PFETs and NFETs, other circuit designs may be used to implement the level shifter 400.

Figure 5:
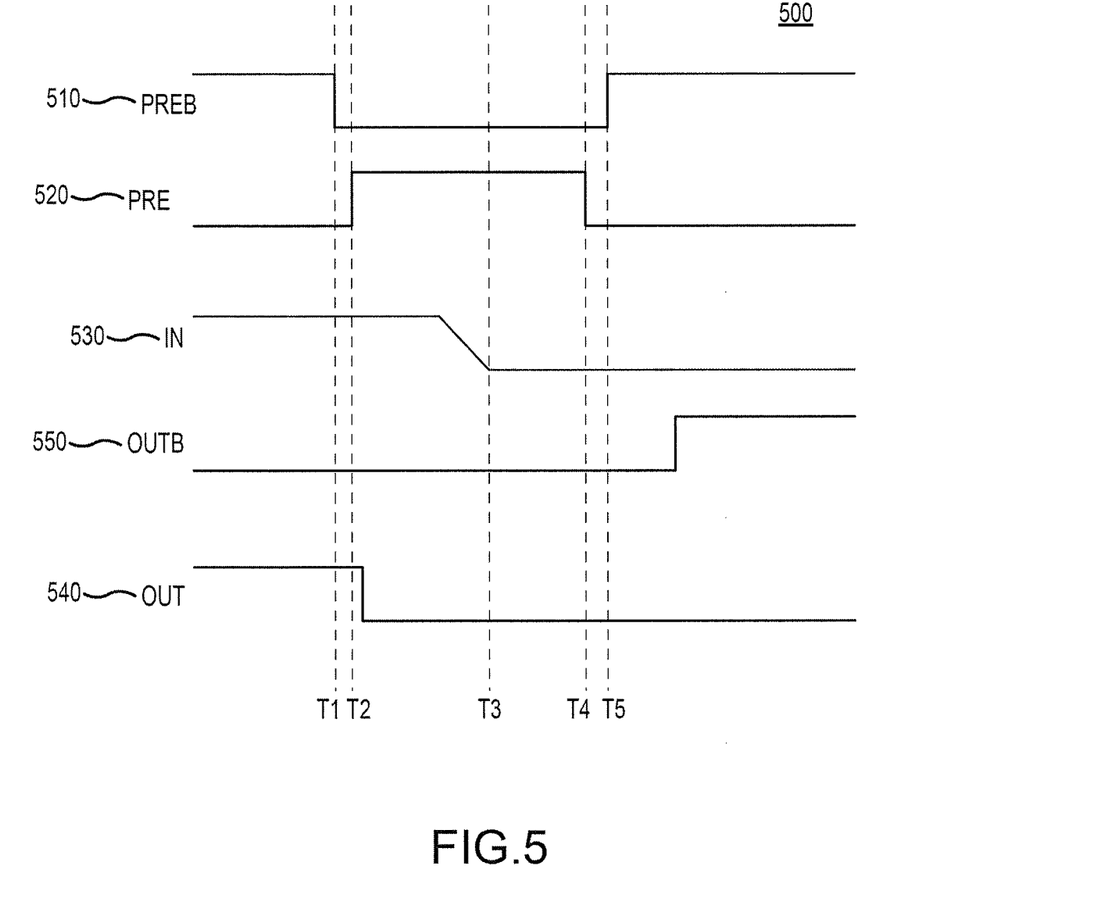
FIG. 5 is an exemplary timing diagram of various signals during operation of a level shifter according to an embodiment of the disclosure.

Referring to FIG. 5, an exemplary timing diagram of various signals during operation of a particular illustrative embodiment of a level shifter is disclosed and generally designated 500. For example, the exemplary timing diagram 500 may illustrate timing characteristics of a level shifters 105(0-N) of FIG. 1 and/or the level shifter 400 of FIG. 4. A precharge bar signal PREB 510 and a precharge signal PRE 520 may correspond to the PREB and PRE signals, respectively, of FIGS. 1 and 4. An input signal IN 530 may correspond to an IN(0-N) signal of FIG. 1 and/or the IN signal of FIG. 4. An output signal OUT 540 and an output bar signal OUTB 550 may correspond to an OUT(0-N) signal and an OUTB(0-N) signal, respectively, of FIG. 1, and/or the OUT signal and the OUTB signals, respectively, of FIG. 4.

In the exemplary timing diagram 500, prior to time T1, the IN signal 530 has a high logical value. Based on the IN signal 530 having the high logical value, the OUT signal 540 is provided at a high logical value and the OUTB signal 550 is providing at a low logical value. At time T1, a precharge of the level shift circuit is initiated by the PREB signal 510 transitioning to a low logical value. The PREB signal 510 having the low logical value may configure a portion of the level shift circuit, such as the P1 transistor 436 and the P2 transistor 446 of FIG. 4, to prevent the OUT 540 signal and the OUTB signal 550 from transitioning to a high logical value.

At time T2, the PRE signal 520 is set to a high logical value. In some embodiments, the high logical value of the PRE signal 520 may be a VDD voltage and a low logical value may be a VNN voltages. Responsive to the PRE signal 520 transitioning to the high logical value, the OUT and OUTB nodes (e.g., the second and first nodes 485 and 480) are precharged to the precharge voltage (e.g., the VNN voltage) (e.g., the OUTB signal 550 remains at the precharge voltage and the OUT signal 540 transitions to the precharge voltage) via precharge transistors, such the N3 transistor 434 and/or the N4 transistor 444 of FIG. 4. At time T3, the IN signal 510 transitions to a low logical value.

At time T3, the IN signal 510 transitions to the low logical value. At time T4, the PRE signal 520 transitions to the low logical value, and at time T5, the PREB signal 510 transitions to the high logical value. Responsive to the PREB signal 510 having the high logical value, the level shift circuit may be configured to provide the OUT signal 540 and the OUTB signal 550 based on logical values of the IN signal 530. Thus, as shown, after time T5, based on the IN signal 530 having a low logical value, the OUTB signal 550 may have the high logical value (e.g., the VDD voltage), while the OUT signal 540 may have the low logical value (e.g., the VNN voltage).

The exemplary timing diagram 500 is a non-limiting illustration to provide a sufficient understanding of embodiments of the disclosure. Those of ordinary skill in the art will appreciate that the relative timing of the signals of the exemplary timing diagram 500 may vary from system to system. For example, the transition of the OUTB signal 540 may occur more slowly or quickly than indicated.

Figure 6:
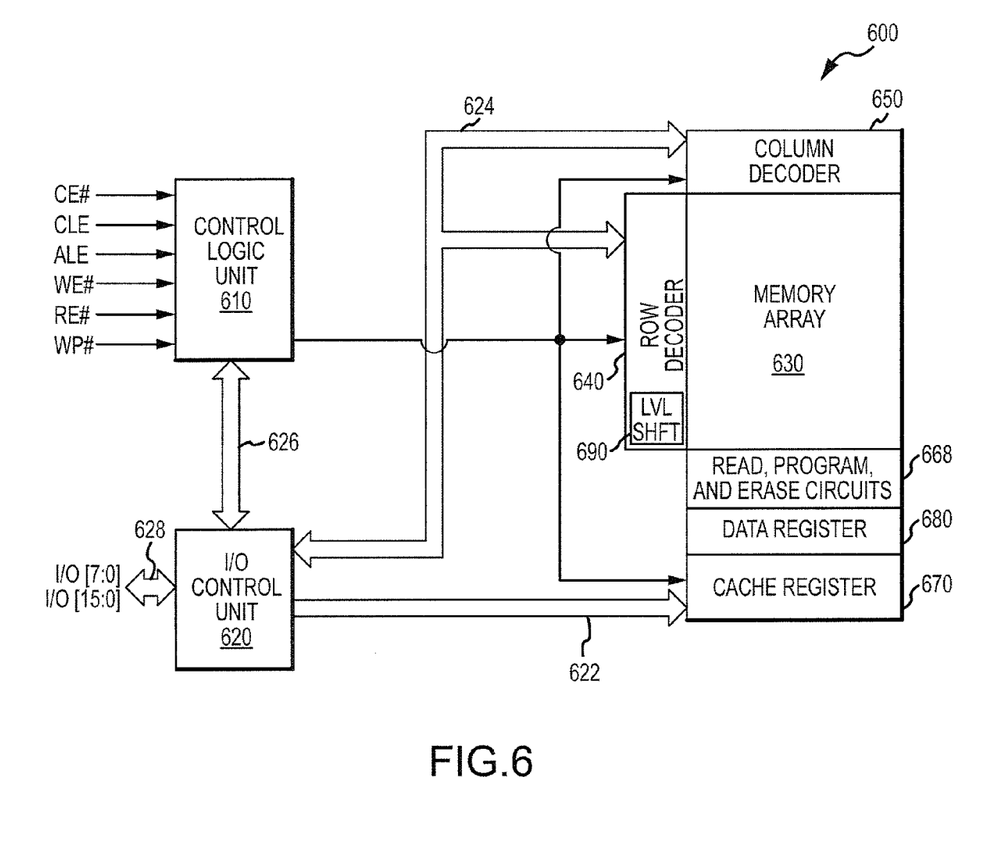
FIG. 6 is a block diagram of a memory including a level shifter according to an embodiment of the disclosure.

FIG. 6 illustrates a memory 600 according to an embodiment of the present invention. The memory 600 includes a memory array 630 with a plurality of memory cells. The memory cells may be non-volatile memory cells, such as NAND flash cells, phase change memory cells, or may generally be any type of memory cells.

Command signals, address signals and write data signals may be provided to the memory 600 as sets of sequential input/output ("I/O") signals transmitted through an I/O bus 628. Similarly, read data signals may be provided from the memory 600 through the I/O bus 628. The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals either externally or through the command bus 626 to control the operation of the memory 600.

The address bus 624 applies block-row address signals to a row decoder 640 and column address signals to a column decoder 650. The row decoder 640 and column decoder 650 may be used to select blocks of memory or memory cells for memory operations, for example, read, program, and erase operations. The row decoder 640 may include one or more level shifters LVL SHFT 690 configured to provide output signals. The one or more level shifters 690 may correspond to the level shifters 105(0-N) of FIG. 1, the level shifter 200 of FIG. 2, and/or the level shifter 400 of FIG. 4.

Additionally or alternatively, other blocks of the memory 600 may include one of more level shifters 690, such as the column decoder 650, the read, program, and erase circuits 668, the cache register 670, the memory array 630, the control logic unit 610, and/or the I/O control unit 620. The column decoder 650 may enable write data signals to be applied to columns of memory corresponding to the column address signals and allow read data signals to be coupled from columns corresponding to the column address signals.

In response to the memory commands decoded by the control logic unit 610, the memory cells in the array 630 are read, programmed, or erased. Read, program, and erase circuits 668 coupled to the memory array 630 receive control signals from the control logic unit 610 and include current generators for generating various reference currents for read, program and erase operations.

After the row address signals have been applied to the address bus 624, the I/O control unit 620 routes write data signals to a cache register 670. The write data signals are stored in the cache register 670 in successive sets each having a size corresponding to the width of the I/O bus 628. The cache register 670 sequentially stores the sets of write data signals for an entire row or page of memory cells in the array 630. All of the stored write data signals are then used to program a row or page of memory cells in the array 630 selected by the block-row address coupled through the address bus 624. In a similar manner, during a read operation, data signals from a row or block of memory cells selected by the block-row address coupled through the address bus 624 are stored in a data register 680. Sets of data signals corresponding in size to the width of the I/O bus 628 are then sequentially transferred through the I/O control unit 620 from the data register 680 to the I/O bus 628.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus, comprising:
  a level shifter configured to provide output signals based on a logical value of an input signal, wherein the level shifter comprises:
  a level shift circuit configured to provide a first output signal of the output signals at a first node and to provide a second output signal of the output signals at a second node; and
  a precharge circuit configured to precharge the first node and the second node to a precharge voltage prior to a transition of the input signal, wherein the precharge circuit includes a first logic gate and a second logic gate, the first logic gate configured to receive the input signal and a precharge signal and provide a first input signal to the level shift circuit, the second logic gate configured to receive an output of the first logic gate and the precharge signal and configured to provide a second input signal to the level shift circuit.

2. The apparatus of claim 1, wherein the precharge circuit comprises:
  a first precharge transistor configured to couple the precharge voltage to the first node based on the precharge signals; and
  a second precharge transistor configured to couple the precharge voltage to the second node based on the precharge signals.

3. The apparatus of claim 2, wherein the first precharge transistor is a first p-type field-effect transistor (PFET) and the second precharge transistor is a second PFET.

4. The apparatus of claim 3, wherein the precharge voltage is a positive voltage.

5. The apparatus of claim 2, wherein the first precharge transistor is a first n-type field-effect transistor (NFET) and the second precharge transistor is a second NFET.

6. The apparatus of claim 5, wherein the precharge voltage is a negative voltage.

7. The apparatus of claim 1, wherein the first logic gate and the second logic gate comprise NOR gates.

8. The apparatus of claim 1, wherein the first logic gate and the second logic gate comprise NAND gates.

9. The apparatus of claim 1, further comprising a controller configured to provide the precharge signals.

10. An apparatus, comprising:
  a level shift circuit configured to, based on a logical value of an input signal, provide a first output signal at a first node and a second output signal at a second node; and
  a precharge circuit configured to precharge the first node and the second node to a precharge voltage responsive to precharge signals, wherein the precharge circuit includes a first logic gate and a second logic gate, the first logic gate configured to receive the input signal and a precharge signal and provide a first input signal to the level shift circuit, the second logic gate configured to receive an output of the first logic gate and the precharge signal and configured to provide a second input signal to the level shift circuit.

11. The apparatus of claim 10, wherein the level shift circuit comprises:
a first hold transistor coupled between a first voltage source and the first node, wherein a gate of the first hold transistor is coupled to the second node; and
a second hold transistor coupled between the first voltage source and the second node, wherein a gate of the second hold transistor is coupled to first second node.

12. The apparatus of claim 11, wherein the first hold transistor and the second hold transistor are p-type, field-effect transistors (PFET), and the first voltage source is a pumped positive voltage source.

13. The apparatus of claim 11, wherein the first hold transistor and the second hold transistor are n-type field-effect transistors (NFET), and the first voltage source is a pumped negative voltage source.

14. The apparatus of claim 11, where in the level shift circuit further comprises:
a first transistor coupled between a second voltage source and the first node, wherein a gate of the first transistor is coupled to the precharge circuit, wherein the first transistor is configured to receive a first input signal based on the input signal and precharge signals; and
a second transistor coupled between the second voltage source and the second node, wherein a gate of the second transistor is coupled to the precharge circuit, wherein the second transistor is configured to receive a second input signal based on the input signal and precharge signals.

15. The apparatus of claim 14, wherein the precharge circuit comprises:
a first precharge transistor coupled between the first voltage source and the first node, wherein a gate of the first precharge transistor is configured to provide the precharge voltage to the first node based on a logical value of a second precharge signal of the precharge signals; and
a second precharge transistor coupled between the first voltage source and the second node, wherein a gate of the second precharge transistor is configured to provide the precharge voltage to the first node based on the logical value the second precharge signal.

16. The apparatus of claim 10, wherein a voltage magnitude of the input signal having a high logical value is less than the precharge voltage.

17. A method, comprising:
precharging an output node of a level shifter to a precharge voltage responsive to a precharge signal via a precharge circuit and prior to a transition of an input signal from a first logical value to a second logical value, wherein the precharge circuit includes a first logic gate and a second logic gate, the first logic gate configured to receive the input signal and a precharge signal and provide a first input signal to a level shift circuit of the level shifter, the second logic gate configured to receive an output of the first logic gate and the precharge signal and configured to provide a second input signal to the level shift circuit;
receiving the transition of the input signal at the level shifter from the first logical value to the second logical value; and
providing an output signal at the output node based on the second logical value of the input signal.

18. The method of claim 17, further comprising decoupling a reference voltage from the output node responsive to a second precharge signal.

19. The method of claim 18, wherein decoupling the reference voltage from the output node occurs prior to precharging the output node of the level shift circuit.

20. The method of claim 17, wherein precharging the output node of the level shift circuit comprises coupling, via the precharge circuit, a negative voltage source to the output node based on the precharge signal.

21. The method of claim 20, further comprising, prior to providing an output signal at the output node, decoupling, via the precharge circuit, the negative voltage source from the output node based on the precharge signal.

22. The method of claim 17, wherein a voltage of the second logical value of the input signal is a first positive voltage and a voltage of the precharge voltage is a second positive voltage that is greater than the first positive voltage.

23. The method of claim 17, wherein the precharge voltage is a negative voltage.

* * * * *

UNITED STATES PATENT AND TRADEMARK OFFICE
CERTIFICATE OF CORRECTION

PATENT NO. : 8,860,488 B2  Page 1 of 1
APPLICATION NO. : 13/787475
DATED : October 14, 2014
INVENTOR(S) : Daniel Chu It is certified that error appears in the above-identified patent and that said Letters Patent is hereby corrected as shown below:

In the Claims

In column 13, line 15, in Claim 12, delete "p-type," and insert -- p-type --, therefor.
In column 13, line 22, in Claim 14, delete "where in" and insert -- wherein --, therefor.

Signed and Sealed this
Twenty-third Day of December, 2014

Michelle K. Lee
*Deputy Director of the United States Patent and Trademark Office*